United States Patent
Sunaga et al.

(10) Patent No.: US 11,267,071 B2
(45) Date of Patent: Mar. 8, 2022

(54) ULTRASONIC BONDING HEAD, ULTRASONIC BONDING DEVICE, AND ULTRASONIC BONDING METHOD

(71) Applicant: TDK CORPORATION, Tokyo (JP)

(72) Inventors: Seijiro Sunaga, Tokyo (JP); Toshinobu Miyagoshi, Tokyo (JP); Tatsunori Otomo, Tokyo (JP)

(73) Assignee: TDK CORPORATION, Tokyo (JP)

( * ) Notice: Subject to any disclaimer, the term of this patent is extended or adjusted under 35 U.S.C. 154(b) by 125 days.

(21) Appl. No.: 16/455,237

(22) Filed: Jun. 27, 2019

(65) Prior Publication Data

US 2020/0001391 A1 Jan. 2, 2020

(30) Foreign Application Priority Data

Jun. 28, 2018 (JP) .............................. JP2018-122744

(51) Int. Cl.
 *B23K 20/00* (2006.01)
 *B23K 20/10* (2006.01)

(52) U.S. Cl.
 CPC .................................. *B23K 20/106* (2013.01)

(58) Field of Classification Search
 CPC ............ B23K 20/1235; B23K 20/1275; B23K 20/122; B23K 20/1225; B23K 20/124; B23K 20/125; B23K 20/227; B23K 2103/04; B23K 2103/08; B23K 2103/14; B23K 2103/18; B23K 2103/26; B23K 20/12; B23K 2203/04; B23K 2203/08; B23K 2203/14; B23K 2203/18; B23K 2203/26
 See application file for complete search history.

(56) References Cited

U.S. PATENT DOCUMENTS

2009/0123778 A1  5/2009  Russell et al.

FOREIGN PATENT DOCUMENTS

| JP | 2002-222834 A | | 8/2002 |
| JP | 2009-090296 A | | 4/2009 |
| JP | 2009090296 A | * | 4/2009 |
| JP | 2009-267238 A | | 11/2009 |
| JP | 2013-237104 A | | 11/2013 |
| JP | 2015-123481 A | | 7/2015 |
| KR | 2012-0001877 U | | 3/2012 |

OTHER PUBLICATIONS

JP-2009090296-A computer english translation (Year: 2009).*
JP-2015-123481-A computer english translation (Year: 2015).*

* cited by examiner

*Primary Examiner* — Erin B Saad
(74) *Attorney, Agent, or Firm* — Oliff PLC

(57) ABSTRACT

An ultrasonic bonding head includes a vibrator unit, a holder, and a pressurizing shaft. The vibrator unit includes a press part formed at a tip of the vibrator unit in a longitudinal axis thereof and configured to press a bonding scheduled part to be bonded. The holder holds a base of the vibrator unit in a cantilever manner so that the tip is a free end. The pressurizing shaft is connected with the holder and transmits a force of pressing the press part against the bonding scheduled part so that the vibrator unit moves substantially perpendicularly to the longitudinal axis. The holder is provided with a restraint portion. The restraint portion contacts with the vibrator unit at a counterforce dispersion position located between a main hold position for holding the vibrator unit by the holder and the free end.

10 Claims, 15 Drawing Sheets

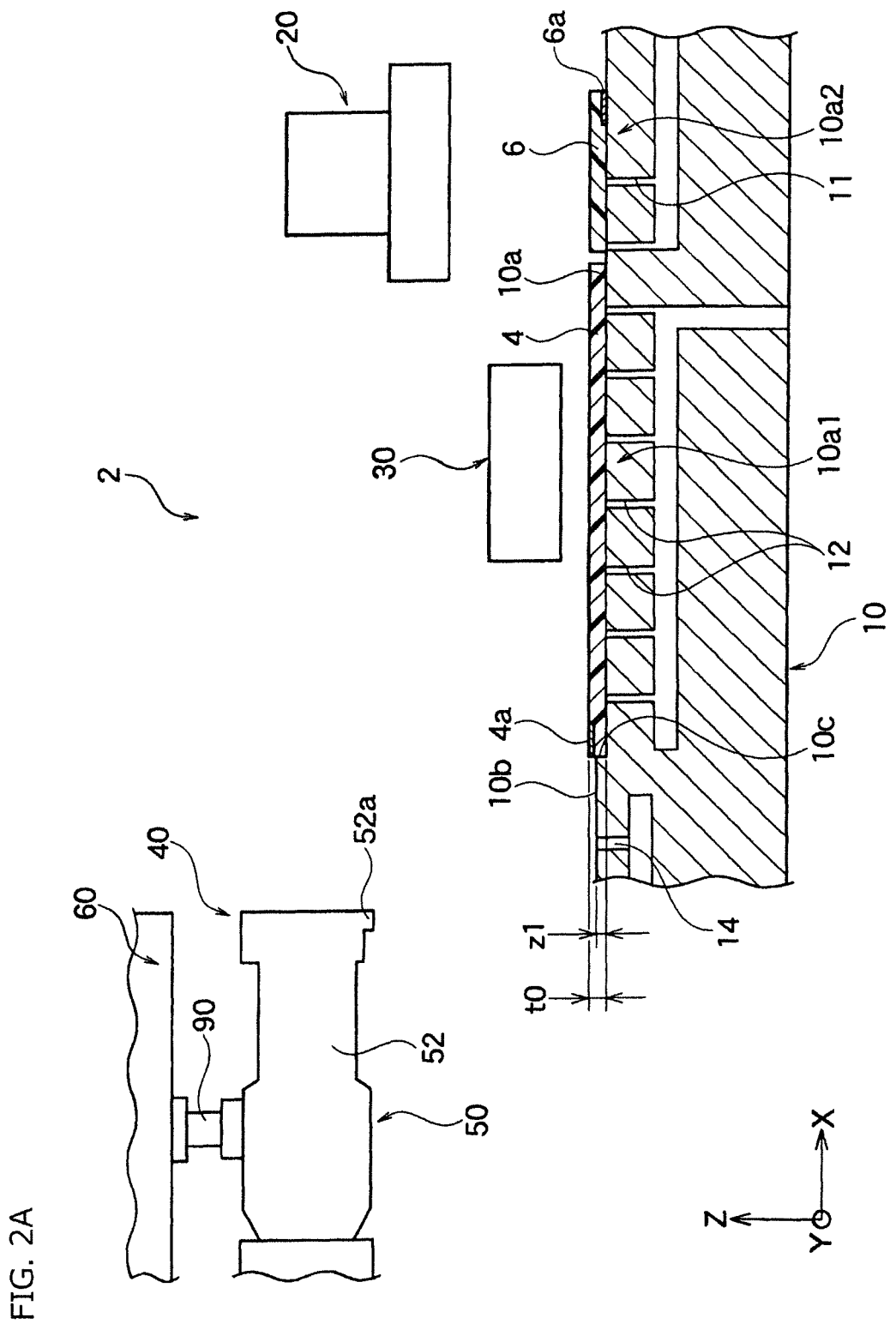

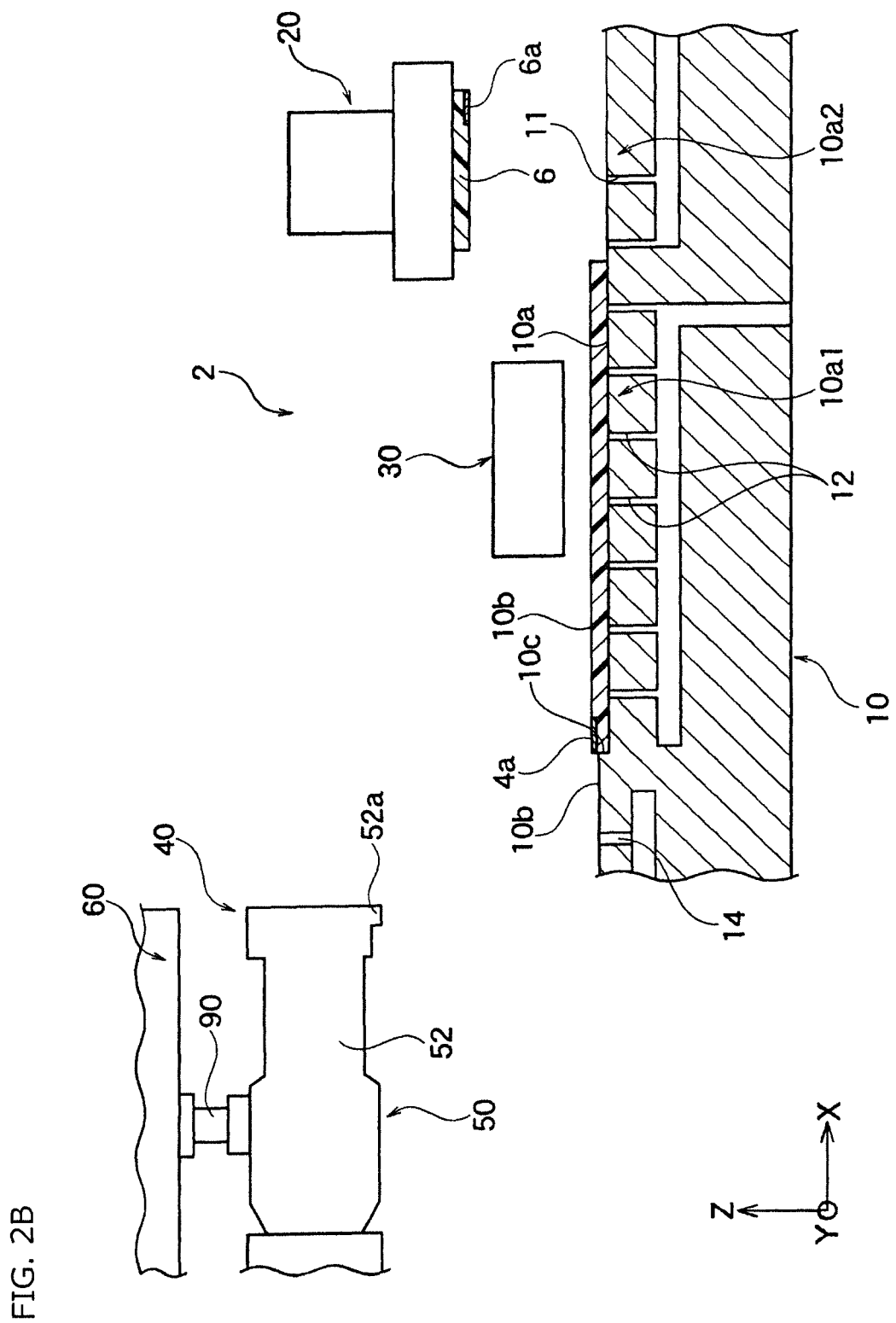

ULTRASONIC BONDING HEAD, ULTRASONIC BONDING DEVICE, AND ULTRASONIC BONDING METHOD

BACKGROUND OF THE INVENTION

The present invention relates to an ultrasonic bonding head, an ultrasonic bonding device, and an ultrasonic bonding method.

For example, the ultrasonic bonding device shown in Patent Document 1 is known. This ultrasonic bonding device carries out an ultrasonic bonding in such a manner that a press part provided at a central part of an ultrasonic horn and holding both sides of the horn in its longitudinal direction is pressed against a bonding scheduled part.

In such a conventional ultrasonic bonding device, the ultrasonic horn needs to have a large length for increasing the ultrasonic vibration of the press part, and the entire device becomes large, which is a problem. Moreover, holders of the ultrasonic horn are on both sides and may thereby disturb the ultrasonic vibration.

A wiring of a glass board to be a display screen board is considered to be ultrasonically bonded with a flexible printed circuit (FPC) or so, but conventional ultrasonic bonding devices are not practical because they hold both sides of the ultrasonic horn and thereby become too large.

Patent Document 1: JP2002222834 (A)

BRIEF SUMMARY OF INVENTION

The present invention has been achieved under such circumstances. It is an object of the invention to provide an ultrasonic bonding head, an ultrasonic bonding device, and an ultrasonic bonding method capable of excellent ultrasonic bonding while the device is downsized.

To achieve the above object, an ultrasonic bonding head according to a first aspect of the present invention includes:

a vibrator unit including a press part formed at a tip of the vibrator unit in a longitudinal axis thereof and configured to press a bonding scheduled part to be bonded;

a holder for holding a base of the vibrator unit in a cantilever manner so that the tip of the vibrator unit along the longitudinal axis is a free end; and a pressurizing shaft connected with the holder and configured to transmit a force of pressing the press part against the bonding scheduled part so that the vibrator unit moves along a perpendicular axis substantially perpendicular to the longitudinal axis, wherein the holder is provided with a restraint portion configured to contact with the vibrator unit at a counterforce dispersion position located between a main hold position for holding the vibrator unit by the holder and the free end of the vibrator unit along the longitudinal axis.

In the ultrasonic bonding head according to the present invention, the holder holds the base of the vibrator unit including an ultrasonic horn in a cantilever manner. Thus, the ultrasonic bonding head according to the present invention can increase the ultrasonic vibration at the press part and can downsize the device compared to when the vibrator unit is held from both sides.

In the ultrasonic bonding head according to the present invention, the holder is provided with the restraint portion configured to contact with the vibrator unit at the counterforce dispersion position on the halfway to the free end of the vibrator unit along the longitudinal axis. Thus, the restraint portion can receive a part of a counterforce of the pressurizing force pressing the press part provided at the free end of the vibrator unit against the bonding scheduled part, and the deformation of the vibrator unit is prevented. As a result, the pressurizing force by the pressurizing shaft can be large, the pressure for the bonding scheduled part at the press part can be high, and the ultrasonic bonding can favorably be carried out. Moreover, the bonding part can be wider, and the flat members are easily ultrasonically bonded.

Preferably, the restraint portion is attached to the holder so as to contact with the vibrator unit at a vibration node closest to the free end of the vibrator unit. This structure increases a counterforce of the pressurizing force being receivable by the restraint portion and effectively prevents the deformation of the vibrator unit. As a result, the pressurizing force of the pressurizing shaft can be large, the pressure for the bonding scheduled part at the press part can be high, and the ultrasonic bonding can favorably be carried out. Moreover, the bonding part can be wider, and the flat members are more easily ultrasonically bonded.

When the restraint portion contacts with the vibrator unit at a vibration node (a position where the vibration has a smallest amplitude), the restraint portion is less likely to disturb the ultrasonic vibration of the vibrator unit.

Preferably, a position where the restraint portion contacts with the vibrator unit and a position where the press part contacts with the bonding scheduled part are different along the longitudinal axis and are mutually on the other side of the longitudinal axis. Thus, the restraint portion contacts with the vibrator unit as little as possible so as to receive the counterforce from the press part and restrain the deformation of the vibrator unit, and the restraint portion is further less likely to disturb the ultrasonic vibration of the vibrator unit.

The holder preferably holds the entire circumference of the vibrator unit at the main hold position, but the restraint portion is preferably in contact with only a part of the entire circumference of the vibrator unit with a small area.

Preferably, a core axis of the pressurizing shaft is substantially parallel to the perpendicular axis, and the pressurizing shaft is connected with the holder so that the core axis is located between the main hold position and the counterforce dispersion position. In this structure, the pressuring force from the pressurizing shaft can effectively be transmitted to the press part, and the pressure added from the press part to the bonding scheduled part increases. Thus, the ultrasonic bonding becomes more reliable.

Preferably, the vibrator unit is provided with a vibration source for ultrasonically vibrating the press part in a parallel direction to the longitudinal axis. When the press part ultrasonically vibrates in a parallel direction to the longitudinal axis, fine metal patterns are easily ultrasonically bonded in a parallel direction to the longitudinal axis.

Preferably, the restraint portion in contact with the vibrator unit has a low friction processed part for improving a relative movement between the restraint portion and the vibrator unit along the longitudinal axis. In this structure, the restraint portion is further less likely to disturb the ultrasonic vibration of the vibrator unit.

The holder may further include an auxiliary holder for holding a cover covering a vibration source of the vibrator unit at a sub hold position differing from the main hold position along the longitudinal axis.

An ultrasonic bonding head according to a second aspect of the present invention includes:

a vibrator unit including a press part formed at a tip of the vibrator unit in a longitudinal axis thereof and configured to press a bonding scheduled part to be bonded;

a holder for holding a base of the vibrator unit along the longitudinal axis in a cantilever manner so that the tip of the vibrator unit along the longitudinal axis is a free end; and a pressurizing shaft connected with the holder and configured to transmit a force of pressing the press part against the bonding scheduled part so that the vibrator unit moves along a perpendicular axis substantially perpendicular to the longitudinal axis, wherein a main hold position and a counterforce dispersion position are arranged in this order from the tip to the base of the vibrator unit along the longitudinal axis, provided that the main hold position is a position where the holder mainly holds the vibrator unit, and that the counterforce dispersion position is a position where a restraint portion provided at the holder contacts with the vibrator unit.

Also in the ultrasonic bonding head according to the second aspect of the present invention, the holder holds the base of the vibrator unit including an ultrasonic horn in a cantilever manner. Thus, the ultrasonic bonding head according to the second aspect of the present invention can increase the ultrasonic vibration at the press part and can downsize the device compared to when the vibrator unit is held from both sides.

In the ultrasonic bonding head according to the present invention, the holder mainly holds the vibrator unit at the main hold position, and the holder is provided with the restraint portion configured to contact with the vibrator unit at the counterforce dispersion position. Thus, the restraint portion can receive a part of a counterforce of the pressurizing force pressing the press part provided at the free end of the vibrator unit against the bonding scheduled part, and the deformation of the vibrator unit is prevented. As a result, the pressurizing force by the pressurizing shaft can be large, the pressure for the bonding scheduled part at the press part can be high, and the ultrasonic bonding can favorably be carried out. Moreover, the bonding part can be wider, and the flat members are easily ultrasonically bonded.

An ultrasonic bonding device according to the present invention includes any of the above-mentioned ultrasonic heads.

The ultrasonic bonding device according to the present invention does not necessarily have a stage, but may have a normal stage or may further have a special stage for placing a first flat member and a second flat member to be bonded.

The stage may include: a lower-side surface on which the first flat member is to be placed; a higher-side surface positioned higher than the lower-side surface by a predetermined step height and on which the second flat member is to be placed; and a step wall surface positioned in a boundary between the lower-side surface and the higher-side surface.

To ultrasonically bond the first flat member and the second flat member, the first flat member is initially placed on the lower-side surface so that an edge of the first flat member is aligned to the step wall surface. Then, the second flat member is placed on the higher-side surface so as to form a laminated portion constituted by laminating at least a part of the second flat member on the first flat member. After that, the press part of the ultrasonic horn is pressed against the laminated portion at a position corresponding to the step wall surface, and the ultrasonic bonding is thereby completed.

When the step wall surface is formed on the stage, the ultrasonic bonding device according to the present invention easily positions the first flat member and the second flat member using the step wall surface and can ultrasonically bond their wiring patterns. Thus, even if the wiring pitch interval is small (e.g., tens of microns or less), the flat members are easily electrically connected without generation of short-circuit failure or so.

In recent years, a large display close to an outer casing size of a device (e.g., a display of smart phones) has been demanded. Thus, the bonding length of the wiring patterns must be short, and the connection reliability is becoming a problem. In the device of the present embodiment, however, metals can ultrasonically be solid-phase bonded, and the connection becomes reliable.

When the step wall surface is formed on the stage, the wiring patterns can securely ultrasonically be bonded even if the laminated portion of the first flat member and the second flat member has a large width (e.g., 60 mm or more).

The stage may further include: a first fixing means for detachably fixing the first flat member on the lower-side surface so that an edge of the first flat member is positioned by contacting with the step wall surface; and a second fixing means for detachably fixing the second flat member on the higher-side surface so that at least a part of the second flat member is laminated on the first flat member.

The first fixing means is not limited and is, for example, a plurality of first suction holes formed on the lower-side surface of the stage. When a negative pressure applies to the plurality of first suction holes, the first flat member can detachably be fixed on the lower-side surface. Likewise, the second fixing means is not limited and is, for example, a plurality of second suction holes formed on the higher-side surface of the stage. When a negative pressure applies to the plurality of second suction holes, the second flat member can detachably be fixed on the higher-side surface.

The step height may be equal to or less than a thickness of the first flat member. In this structure, even if the stage has manufacturing errors, the upper surface of the first flat member is not lower than the higher-side surface and is flush with the higher-side surface or slightly protrudes upward. Thus, when the second flat member is placed on the higher-side surface, the first flat member and the second flat member always contact with each other at their laminated portion (overlapping portion). Thus, the first flat member and the second flat member can securely ultrasonically be bonded, and the connection becomes more reliable.

An ultrasonic bonding method according to the first aspect of the present invention ultrasonically bonds a bonding scheduled part using any of the above-mentioned ultrasonic bonding heads.

An ultrasonic bonding method according to the second aspect of the present invention includes the steps of:

holding a base of a vibrator unit along a longitudinal axis thereof in a cantilever manner so that a tip of the vibrator unit along the longitudinal axis is a free end; and pressing a press part provided at the tip of the vibrator unit against a bonding scheduled part to be bonded and ultrasonically vibrating the press part in the longitudinal axis, wherein the vibrator unit includes two or more vibration nodes along the longitudinal axis, and a main hold position and a counterforce dispersion position are positioned at the vibration nodes differing from each other, provided that the main hold position is a position where the holder mainly holds the vibrator unit, and that the counterforce dispersion position is a position where a restraint portion provided at the holder contacts with the vibrator unit.

In the ultrasonic bonding method according to the first and second aspects of the present invention, the holder holds the base of the vibrator unit including an ultrasonic horn in a cantilever manner. Thus, the ultrasonic bonding head according to the first and second aspects of the present invention can increase the ultrasonic vibration at the press part and can downsize the device compared to when the vibrator unit is held from both sides.

In the ultrasonic bonding method according to the present invention, the holder is provided with the restraint portion configured to contact with the vibrator unit at the counterforce dispersion position. Thus, the restraint portion can receive a part of a counterforce of the pressurizing force pressing the press part provided at the free end of the vibrator unit against the bonding scheduled part, and the deformation of the vibrator unit is prevented. As a result, the pressurizing force by the pressurizing shaft can be large, the pressure for the bonding scheduled part at the press part can be high, and the ultrasonic bonding can favorably be carried out. Moreover, the bonding part can be wider, and the flat members are easily ultrasonically bonded.

In particular, since the main hold position and the counterforce dispersion position are positioned at the vibration nodes differing from each other, the ultrasonic vibration of the vibrator unit is less likely to be disturbed by the holder at the main hold position, and the restraint portion is less likely to disturb the ultrasonic vibration of the vibrator unit.

BRIEF DESCRIPTION OF DRAWINGS

FIG. 2A is an entire view illustrating an ultrasonic bonding device including the ultrasonic bonding head shown in FIG. 1A.

FIG. 2B is a schematic view illustrating a step of an ultrasonic bonding method using the ultrasonic bonding device shown in FIG. 2A.

DETAILED DESCRIPTION OF INVENTION

Figure 1A:
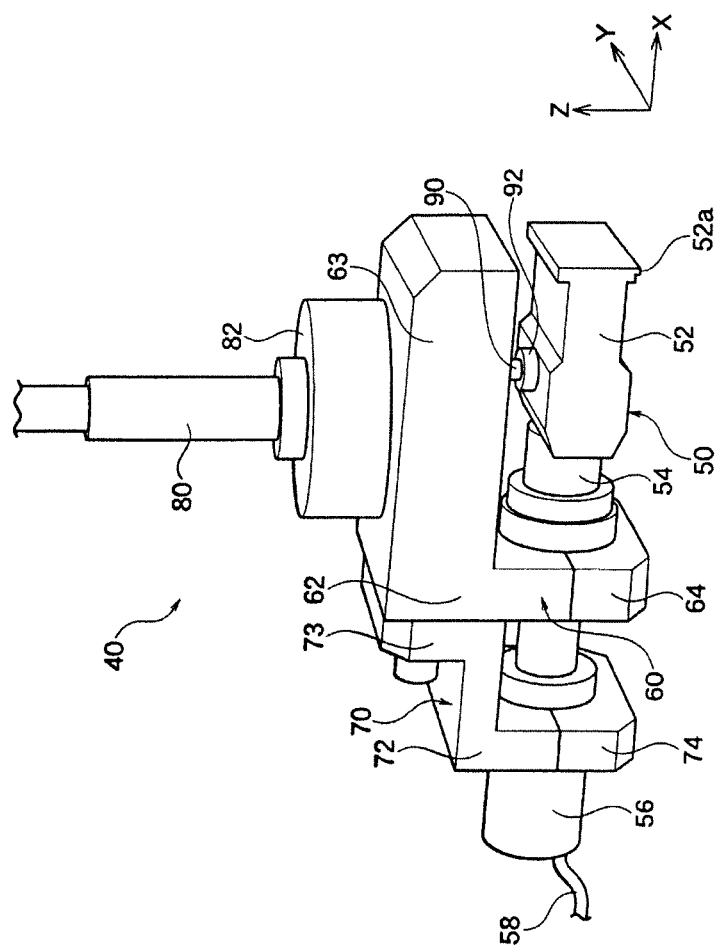
FIG. 1A is a schematic perspective view of an ultrasonic bonding head according to an embodiment of the present invention.

Hereinafter, the present invention is described based on embodiments shown in the figures.

First Embodiment

An ultrasonic bonding head 40 is described based on FIG. 1A to FIG. 1M. The ultrasonic bonding head 40 of the present embodiment includes an ultrasonic vibrator unit 50, a holder 60, and a pressurizing shaft 80. The holder 60 holds the ultrasonic vibrator unit 50. The pressurizing shaft 80 is connected with the holder 60 and moves the holder 60 and the ultrasonic vibrator unit 50 in the Z-axis direction.

As shown in FIG. 1H to FIG. 1M, the ultrasonic vibrator unit 50 includes an ultrasonic horn 52, a booster 54, and a vibration source cover 56, and these are connected in line in this order along the X-axis direction. The vibration source cover 56 contains a vibration source (not illustrated). The vibration source is not limited and is, for example, a piezoelectric element.

The vibration source is positioned and fixed inside the vibration source cover 56, but is not directly fixed to an auxiliary holder 70 mentioned below (see FIG. 1A). The vibration source vibrates by electric power. To supply electric power to the vibration source, a cable 58 protrudes from the rear of the vibration source cover 56 in the X-axis direction.

As shown in FIG. 1A, the booster 54 is fixed and connected with the front of the vibration source in the X-axis direction (toward the tip of the ultrasonic horn 52) contained inside the vibration source cover 56. The booster 54 is a normal booster used for ultrasonic bonding devices and extends in the X-axis direction. The vibration source and the booster 54 are connected by screw, for example.

The ultrasonic horn 52 is fixed and connected with the tip of the booster 54 in the X-axis direction. The booster 54 and the ultrasonic horn 52 are connected in a similar manner to the connection between the vibration source and the booster 54. In the present embodiment, the booster 54 has a column shaft shape whose outer diameter changes along the axial direction.

Figure 5A:
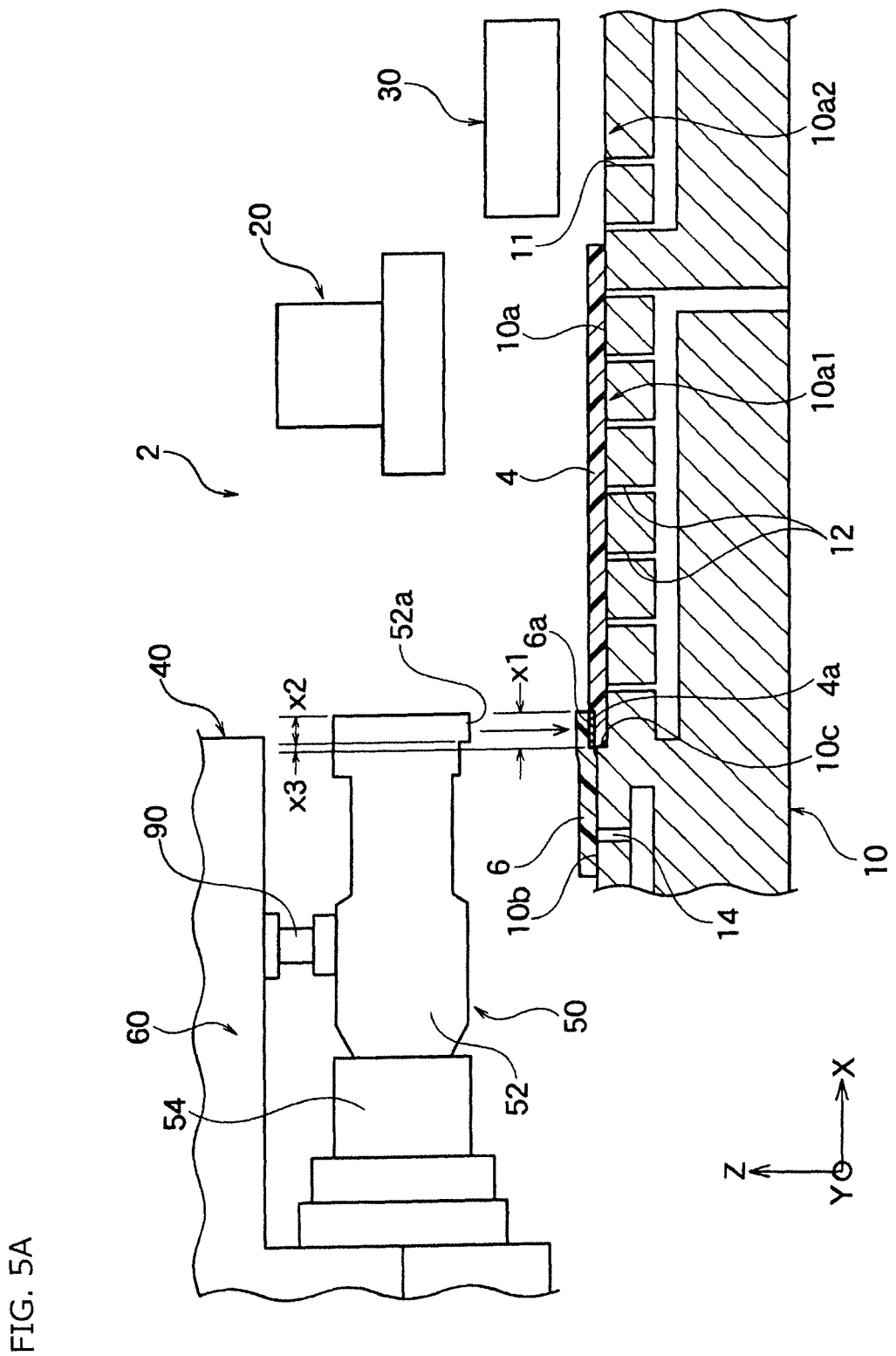
FIG. 5A is a schematic view illustrating the next step of FIG. 4.

The ultrasonic horn 52 has a special column shape being long in the axial direction. A press part 52a protruding in the Z-axis direction and linearly extending in the Y-axis direction is formed at the lower end of the ultrasonic horn 52 in the Z-axis direction at the tip of the ultrasonic horn 52 in the X-axis direction. The width of the press part 52a in the Y-axis direction is determined depending upon, for example, a width of a bonding scheduled part to be ultrasonically bonded in the Y-axis direction. As described below, a width X2 of the press part 52a in the X-axis direction shown in FIG. 5A is determined depending upon, for example, a width of the bonding scheduled part in the X-axis direction and is 0.2 to 2.0 mm in the present embodiment, although not limited.

Figure 1B:
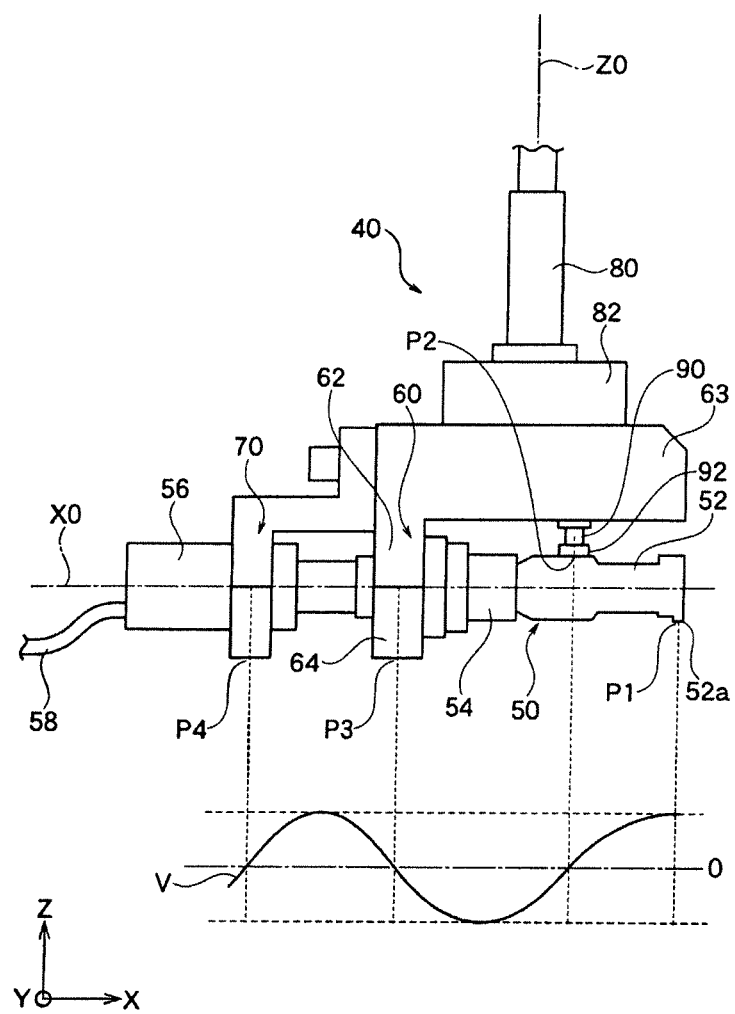
FIG. 1B is a schematic view illustrating a relation between a front view and vibration nodes of the ultrasonic bonding head shown in FIG. 1A.
Figure 1C:
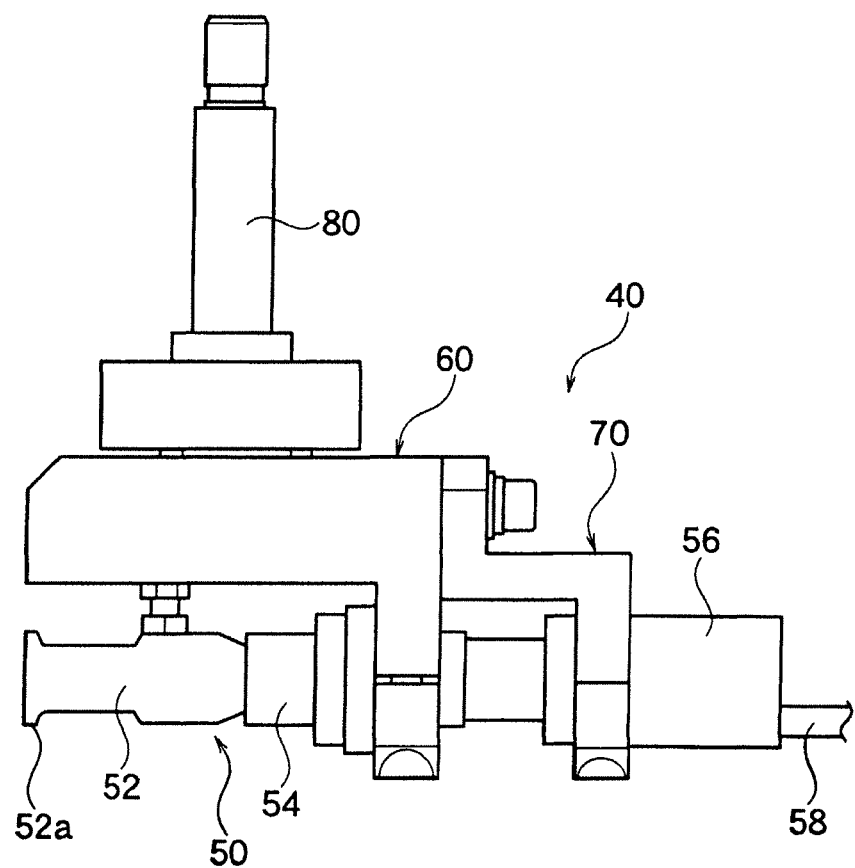
FIG. 1C is a back view of the ultrasonic bonding head shown in FIG. 1B.
Figure 1D:
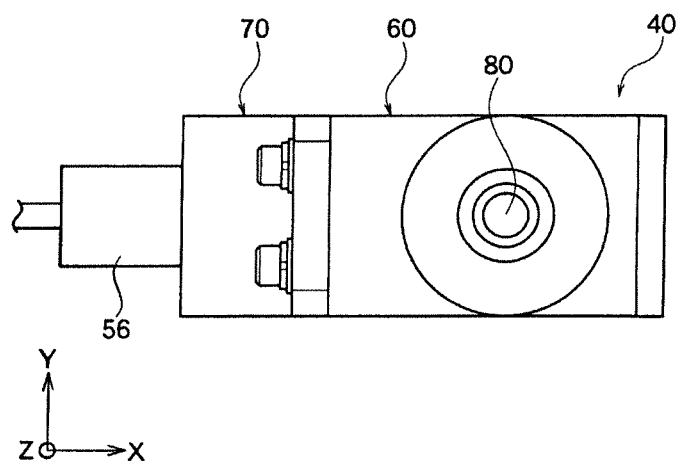
FIG. 1D is a plane view of the ultrasonic bonding head shown in FIG. 1B.
Figure 1E:
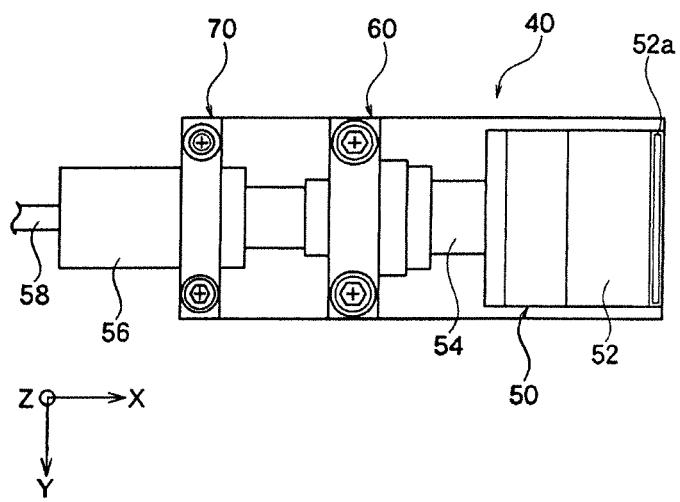
FIG. 1E is a bottom view of the ultrasonic bonding head shown in FIG. 1B.
Figure 1F:
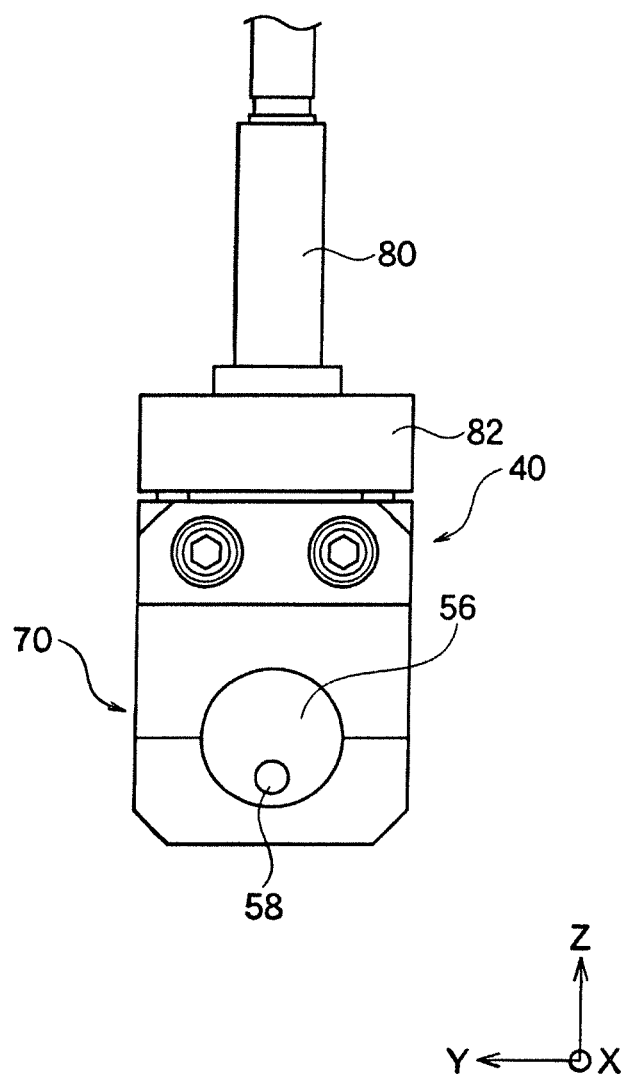
FIG. 1F is a left-side view of the ultrasonic bonding head shown in FIG. 1B.
Figure 1G:
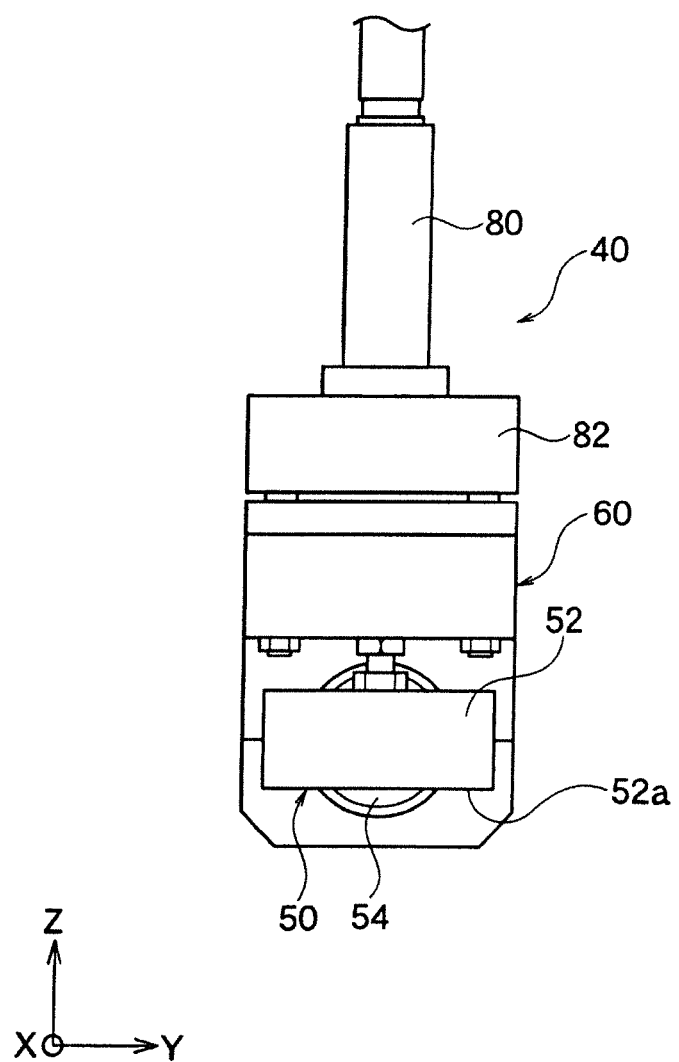
FIG. 1G is a right-side view of the ultrasonic bonding head shown in FIG. 1B.
Figure 1H:
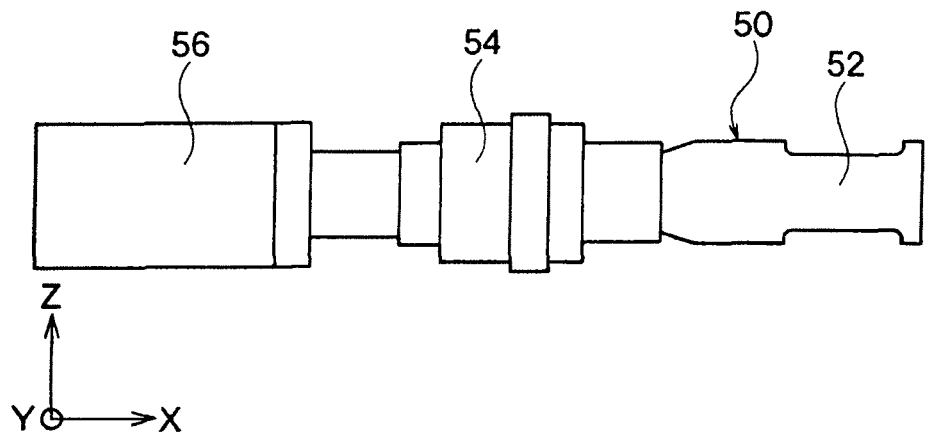
FIG. 1H is a front view of an ultrasonic vibrator unit shown in FIG. 1A.
Figure 1I:
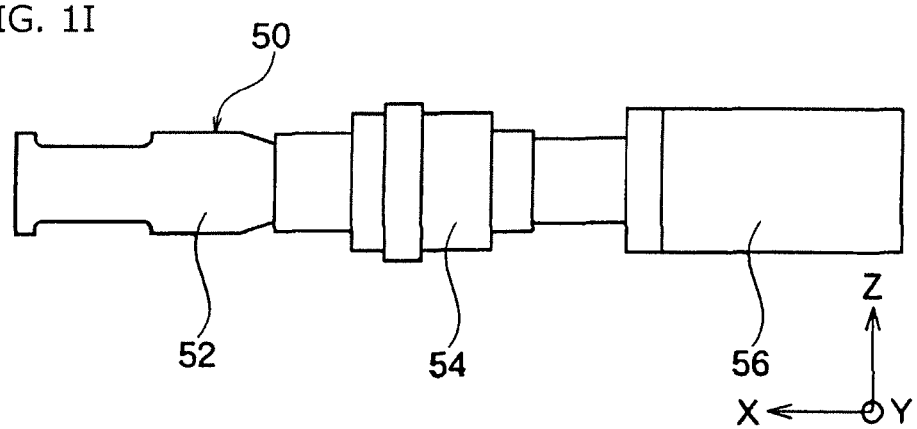
FIG. 1I is a back view of the ultrasonic vibrator unit shown in FIG. 1H.
Figure 1J:
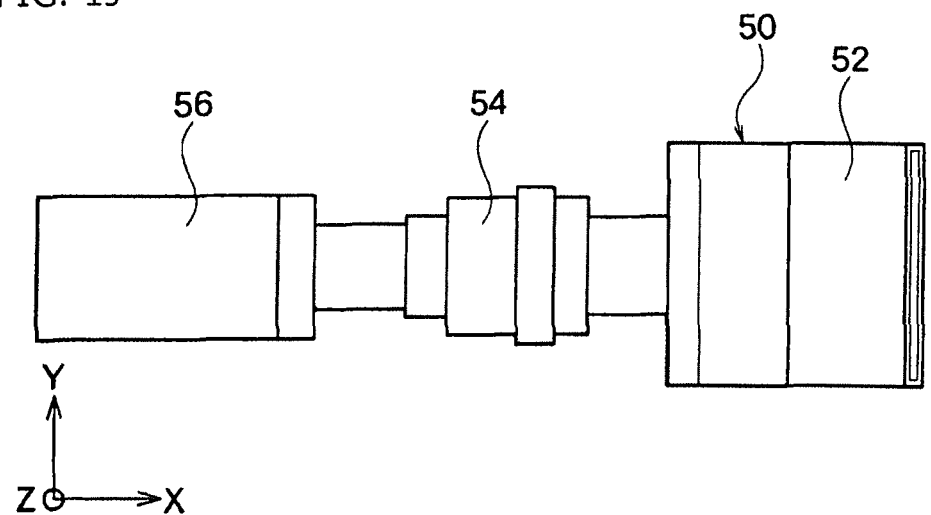
FIG. 1J is a plane view of the ultrasonic vibrator unit shown in FIG. 1H.
Figure 1K:
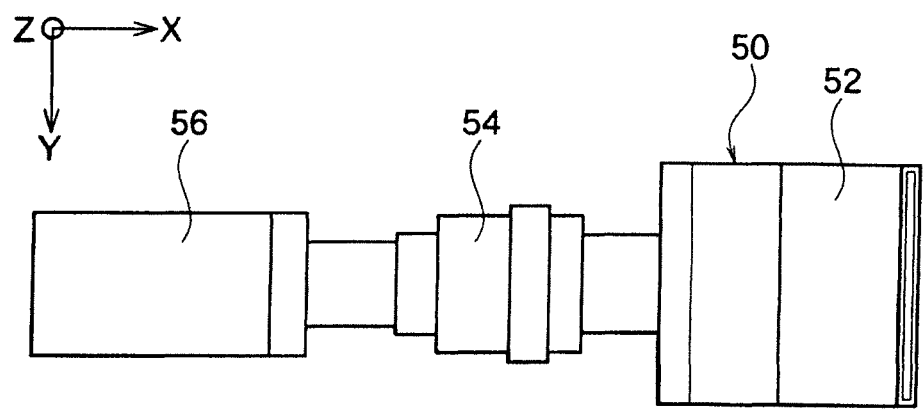
FIG. 1K is a bottom view of the ultrasonic vibrator unit shown in FIG. 1H.
Figure 1L:
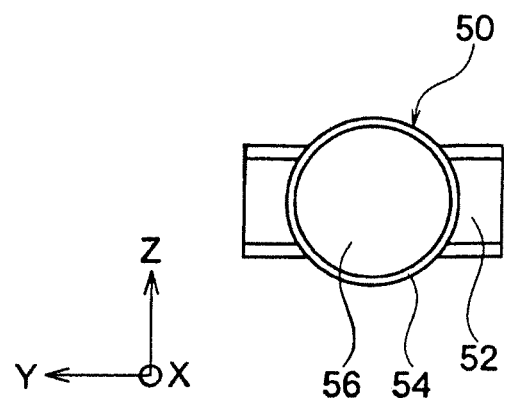
FIG. 1L is a left-side view of the ultrasonic vibrator unit shown in FIG. 1H.
Figure 1M:
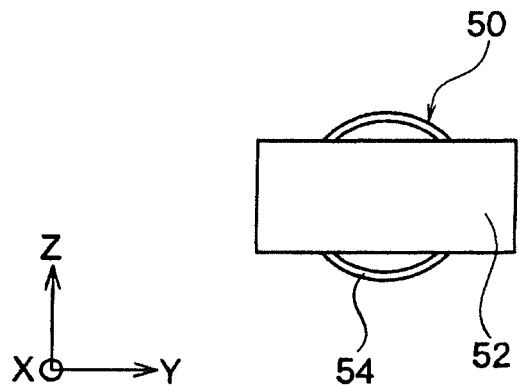
FIG. 1M is a right-side view of the ultrasonic vibrator unit shown in FIG. 1H.

As shown in FIG. 1B, the vibration source contained in the vibration source cover 56 vibrates in the X-axis direction, and the vibration is amplified by the booster 54, travels to the ultrasonic horn 52, and has a large amplitude at the press part 52a. The ultrasonic vibrator unit 50 formed from the ultrasonic horn 52, the booster 54, and the vibration source has a center axis (longitudinal axis) X0 and vibrates along the longitudinal axis X0 (parallel to the X-axis). The ultrasonic vibrator unit 50 has a point where an amplitude V of the vibration (stationary wave) is large (vibration anti-node) and a point where the amplitude V is minimum (zero) (vibration node). In the present embodiment, as illustrated in the figure, the ultrasonic vibrator unit 50 has at least two vibration nodes along the longitudinal axis X0.

The ultrasonic vibrator unit 50 is held at a main hold position P3 by the holder 60 so that the tip of the ultrasonic vibrator unit 50 in the longitudinal axis X0 (near the press part 52a) is a free end (an end capable of free movement). In the present embodiment, the main hold position P3 is on the halfway of the booster 54 and is positioned at the vibration node closer to the vibration source than the tip of the ultrasonic horn 52.

The rear of the holder 60 in the longitudinal axis X0 is connected with the auxiliary holder 70 by bolt or so. The auxiliary holder 70 holds the vibration source cover 56 at a sub hold position P4. The sub hold position P4 is preferably positioned at the vibration node closest to the vibration source, but is not necessarily positioned at the vibration node. This is because, at the sub hold position P4, the auxiliary holder 70 holds the vibration source cover 56, but does not hold the vibration source itself.

In the present embodiment, the lower end of the tip of the ultrasonic horn 52 is the press part 52a. The vibration source is attached to the ultrasonic vibrator unit 50 so that the press part 52a is positioned at a tip position P1 of the vibration anti-node where the amplitude V of the vibration ultrasonically vibrating in the parallel direction to the X0 becomes large to the maximum.

In the present embodiment, the holder 60 is provided with a restraint pin (restraint portion) 90 in contact (not fixed) with the ultrasonic vibrator unit 50 at a counterforce dispersion position (supporting point) P2 between the main hold position (a load point of a pressuring force) P3, where the holder 60 holds the booster 54 of the ultrasonic vibrator unit 50, and the free end of the ultrasonic vibrator unit 50 along the longitudinal axis X0 (tip position P1/working point).

A core axis Z0 of the pressurizing shaft 80 is substantially parallel to the Z-axis (perpendicular axis). The pressurizing shaft 80 is connected with the holder 60 via a fixed board 82 so that the core axis Z0 is positioned between the main hold position P3 and the counterforce dispersion position P2. The pressurizing shaft 80 is connected with the holder 60 and transmits a force of pressing the press part 52a against the bonding scheduled part (not illustrated in FIG. 1B) to the holder 60 so that the ultrasonic vibrator unit 50 moves along the Z-axis (a perpendicular axis substantially perpendicular to the longitudinal axis X0).

In the present embodiment, the restraint pin 90 is attached to the holder 60 so that a contact part 92 of the restraint pin 90 is in contact with the ultrasonic horn 52 of the ultrasonic vibrator unit 50 at the counterforce dispersion position P2 of the vibration node closest to the free end of the ultrasonic vibrator unit 50. The position P2 (the restraint pin 90 is in contact with the ultrasonic vibrator unit 50) and the position P1 (the press part 52a is contacts with the bonding scheduled part) are different along the longitudinal axis X0 and are mutually on the other side of the longitudinal axis X0 in the Z-axis.

In the present embodiment, the contact part 92 of the restraint pin 90 configured to contact with the ultrasonic horn 52 of the ultrasonic vibrator unit 50 has a low friction processed part for improving a relative movement between the horn 52 and the contact part 92 along the longitudinal axis X0. The low friction processing is not limited, and for example, the contact part 92 is made of a low friction material, such as fluororesin. The low friction material, such as paraffin wax and wax, may be applied to or formed on the contact part 92. A fluororesin tape may be pasted on the contact part 92.

The contact part 92 of the restraint pin 90 has any size, but preferably has a size that is large enough to receive a counterforce added to the counterforce dispersion position P2 from the tip position P1 and is also small as much as possible for reduction in friction force. The width of the contact part 92 in the Y-axis direction is equal to or less than the width of the ultrasonic horn 52 in the Y-axis direction. In view of avoid disturbing the vibration of the horn 52, the width of the contact part 92 in the Y-axis direction is preferably smaller. The width of the contact part 92 in the X-axis direction is equal to or less than the width of the ultrasonic horn 52 in the X-axis direction. In view of avoid disturbing the vibration of the horn 52, the width of the contact part 92 in the X-axis direction is preferably smaller. The outer diameter of the restraint pin 90 may be smaller than that of the contact part 92, but is preferably as large as a size capable of receiving the counterforce.

As shown in FIG. 1A, the holder 60 includes an upper holder 62 and a lower holder 64, and these are connected with each other by bolt or so at the main hold position P3 shown in FIG. 1B. Thus, the booster 54 of the ultrasonic vibrator unit 50 is held along its entire circumference. Incidentally, the upper holder 62 and the lower holder 64 of the holder 60 are in contact with the booster 54 with a predetermined width in the X-axis direction, but the holder 60 substantially holds the booster 54 at the main hold position P3, because a cover is formed on the outer circumference of the booster 54, and the holder 60 holds the outer circumference of the cover.

A pressure transmission block 63 extending toward the tip of the ultrasonic horn 52 in the X-axis direction and covering the above of the ultrasonic horn 52 in the Z-axis direction is integrally formed with the upper holder 62. Except for the restraint pin 90, the pressure transmission block 63 does not contact with the ultrasonic horn 52. The fixed board 82 is fixed on the upper surface of the pressure transmission block 63. The pressurizing shaft 80 is fixed to the holder 60 via the fixed board 82.

An attachment flange 73 integrally formed with an upper holder 72 of the auxiliary holder 70 is fixed to the upper holder 62 of the holder 60 by bolt or so. The upper holder 72 is combined with a lower holder 74 and holds the outer circumference of the vibration source cover 56 at the sub hold position P4 shown in FIG. 1B.

In the ultrasonic bonding head 40 according to the present embodiment, since the holder 60 holds the base of the ultrasonic vibrator unit 50 including the ultrasonic horn 52 in a cantilever manner, the ultrasonic vibration can be large at the press part 52a, and the device including the head 40 can be downsized compared to when the ultrasonic vibrator unit 50 is held from both sides.

In the ultrasonic bonding head 40 according to the present embodiment, the holder 60 is provided with the restraint pin 90 configured to contact with the ultrasonic vibrator unit 50 at the counterforce dispersion position P2 on the halfway to the free end of the ultrasonic vibrator unit 50 along the longitudinal axis X0. Thus, the restraint pin 90 can receive a part of a counterforce of the pressurizing force pressing the press part 52a provided at the free end of the ultrasonic vibrator unit 50 against the bonding scheduled part, and the deformation of the ultrasonic vibrator unit 50 is prevented. As a result, the pressurizing force by the pressurizing shaft 80 can be large, the pressure for the bonding scheduled part at the press part 52a can be high, and the ultrasonic bonding can favorably be carried out. Moreover, the bonding part can be wide in the Y-axis direction, and the flat members are easily ultrasonically bonded.

The restraint pin 90 is attached to the holder 60 so as to contact with the ultrasonic vibrator unit 50 at the position P2 of the vibration node closest to the free end of the ultrasonic vibrator unit 50. This structure increases a counterforce of the pressurizing force being receivable by the restraint pin 90 and effectively prevents the deformation of the ultrasonic vibrator unit 50. As a result, the pressurizing force of the pressurizing shaft 80 can be large, the pressure for the bonding scheduled part at the press part 52a can be high, and the ultrasonic bonding can favorably be carried out. Moreover, the bonding part can be wider in the Y-axis direction, and the flat members are more easily ultrasonically bonded.

When the restraint pin 90 contacts with the ultrasonic vibrator unit 50 at the position P2 of the vibration node (a position where the vibration has a smallest amplitude), the restraint pin 90 is less likely to disturb the ultrasonic vibration of the ultrasonic vibrator unit 50.

The position P2 (the restraint pin 90 contacts with the ultrasonic vibrator unit 50) and the position P1 (the press part 52a contacts with the bonding scheduled part) are different along the longitudinal axis X0 and are mutually on the other side of the longitudinal axis X0 in the Z-axis direction. Thus, the restraint pin 90 contacts with the ultrasonic vibrator unit 50 as little as possible so as to receive the counterforce from the press part 52a and restrain the deformation of the ultrasonic vibrator unit 50, and the contact part 92 of the restraint pin 90 is further less likely to disturb the ultrasonic vibration of the ultrasonic vibrator unit 50.

The core axis Z0 of the pressurizing shaft 80 is substantially parallel to the Z-axis, and the pressurizing shaft 80 is connected with the holder 60 so that the core axis Z0 is located between the main hold position P3 and the counterforce dispersion position P2. In this structure, the pressuring force from the pressurizing shaft 80 can effectively be transmitted to the press part 52a, and the pressure added from the press part 52a to the bonding scheduled part increases. Thus, the ultrasonic bonding becomes more reliable.

Moreover, the ultrasonic vibrator unit 50 is provided with the vibration source for ultrasonically vibrating the press part 52a in a parallel direction to the longitudinal axis X0. When the press part 52a ultrasonically vibrates in a parallel direction to the longitudinal axis X0, fine metal patterns are easily ultrasonically bonded in a parallel direction to the longitudinal axis X0.

The ultrasonic bonding head 40 according to the present embodiment does not necessarily have a stage, but may have a normal stage or may further have a special stage for placing a first flat member and a second flat member to be bonded as shown in Third Embodiment below.

In the ultrasonic bonding method according to the present embodiment, the bonding scheduled part is ultrasonically bonded using the above-mentioned ultrasonic bonding head 40. Specifically, the ultrasonic bonding method according to the present embodiment includes a step of holding the base of the ultrasonic vibrator unit 50 in a cantilever manner so that the tip of the ultrasonic vibrator unit 50 along the longitudinal axis X0 is a free end. Then, the press part 52a provided at the tip of the ultrasonic vibrator unit 50 presses the bonding scheduled part to be bonded and ultrasonically vibrates in the longitudinal axis X0.

The ultrasonic vibrator unit 50 includes two or more vibration nodes along the longitudinal axis X0, and the main hold position P3 and the counterforce dispersion position P2 are positioned at the vibration nodes differing from each other, provided that the main hold position P3 is a position where the holder 60 mainly holds the ultrasonic vibrator unit 50, and that the counterforce dispersion position P2 is a position where the restraint pin 90 provided at the holder 60 contacts with the ultrasonic vibrator unit 50.

In the ultrasonic bonding method according to the present embodiment, since the holder 60 holds the base of the ultrasonic vibrator unit 50 including the ultrasonic horn 52 in a cantilever manner, the ultrasonic vibration can be large at the press part 52a, and the device can be downsized compared to when the ultrasonic vibrator unit 50 is held from both sides.

Since the main hold position P3 and the counterforce dispersion position P2 are positioned at the vibration nodes differing from each other, the ultrasonic vibration of the ultrasonic vibrator unit 50 is less likely to be disturbed by the holder 60 at the main hold position P3, and the restraint pin 90 is less likely to disturb the ultrasonic vibration of the ultrasonic vibrator unit 50.

Second Embodiment

Figure 6:
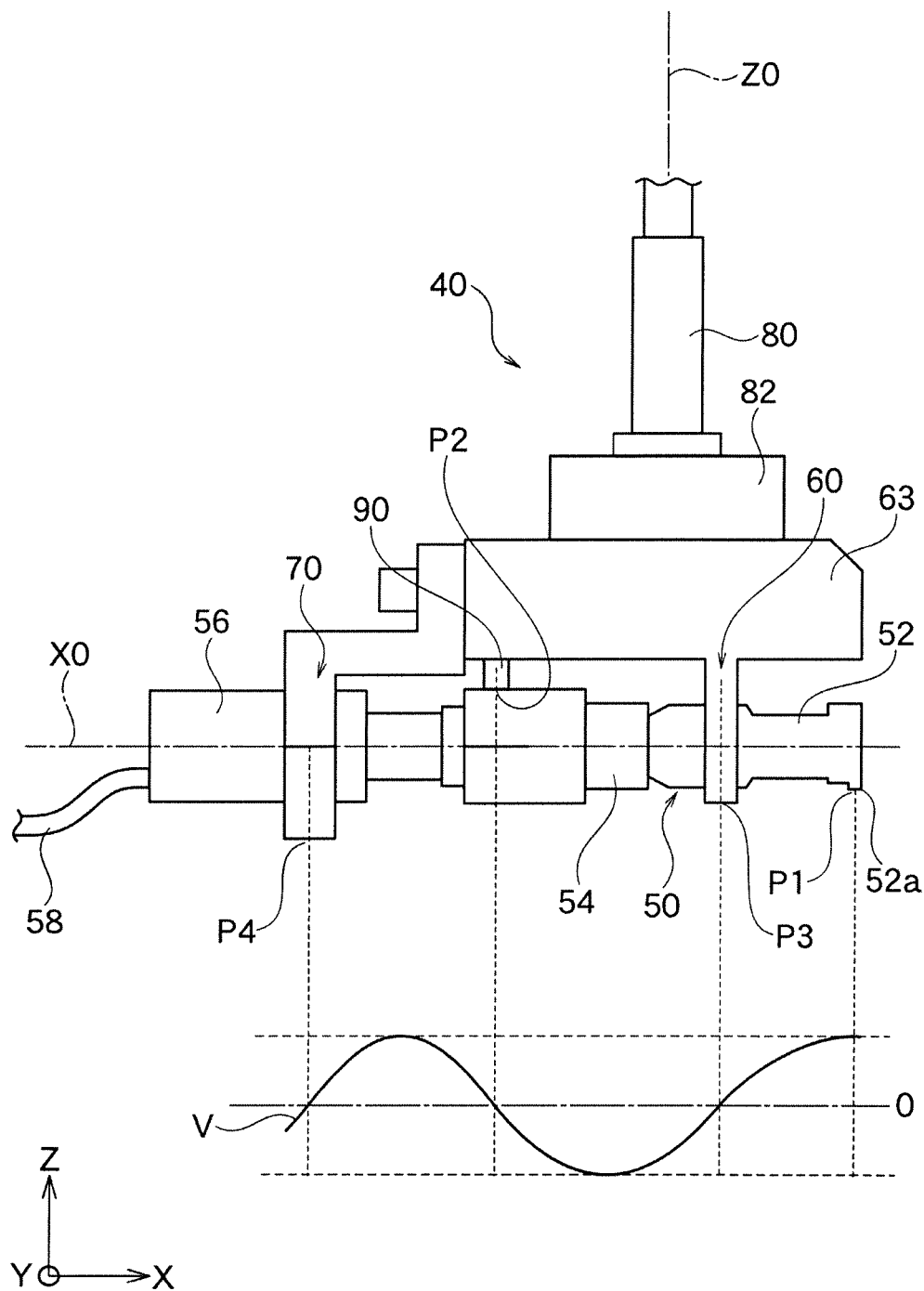
FIG. 6 is a schematic view illustrating a variation of the ultrasonic bonding head shown in FIG. 1B.

An ultrasonic bonding head according to Second Embodiment is similar to the ultrasonic bonding head 40 according to First Embodiment except that the main hold position P3 and the counterforce dispersion position P2 shown in FIG. 1B are positioned opposite in the X-axis direction as shown in FIG. 6. That is, the main hold position P3 and the counterforce dispersion position P2 are arranged in this order from the tip to the base of the ultrasonic vibrator unit 50 along the longitudinal axis X0 of the ultrasonic vibrator unit 50.

At the main hold position P3, the holder 60 holds the ultrasonic vibrator unit 50. At the counterforce dispersion position P2, the restraint pin 90 is in contact with a part of the outer circumference of the ultrasonic vibrator unit 50. The restraint pin 90 may be in contact with the ultrasonic horn 52 or the booster 54. The holder 60 may hold the ultrasonic horn 52 or the booster 54.

In the ultrasonic vibrator unit 50 according to Second Embodiment, the holder 60 also holds the base of the ultrasonic vibrator unit 50 including the ultrasonic horn 52 in a cantilever manner. Thus, the ultrasonic vibration can be large at the press part 52a, and the device can be downsized compared to when the ultrasonic vibrator unit 50 is held from both sides.

Third Embodiment

Figure 3:
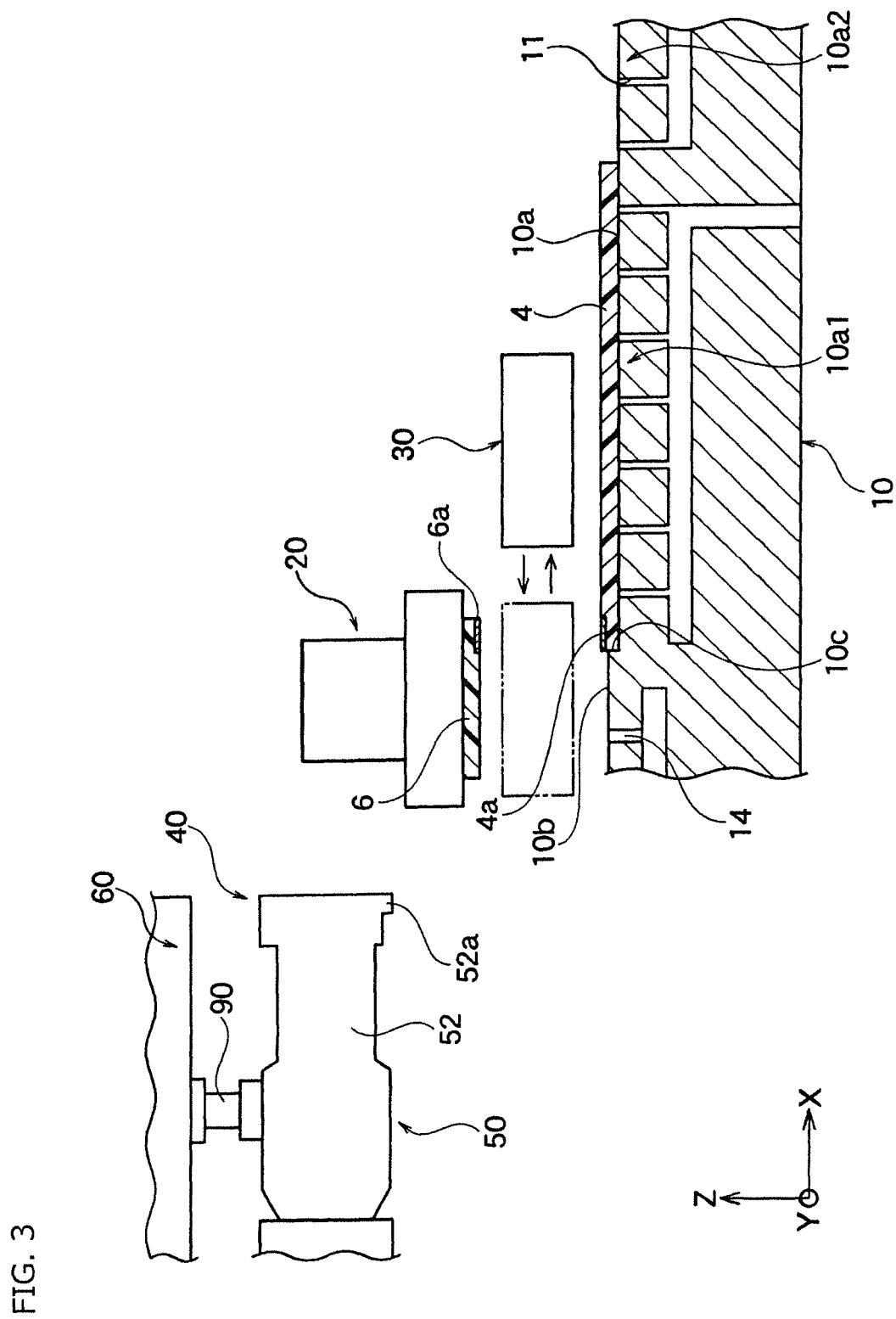
FIG. 3 is a schematic view illustrating the next step of FIG. 2.
Figure 4:
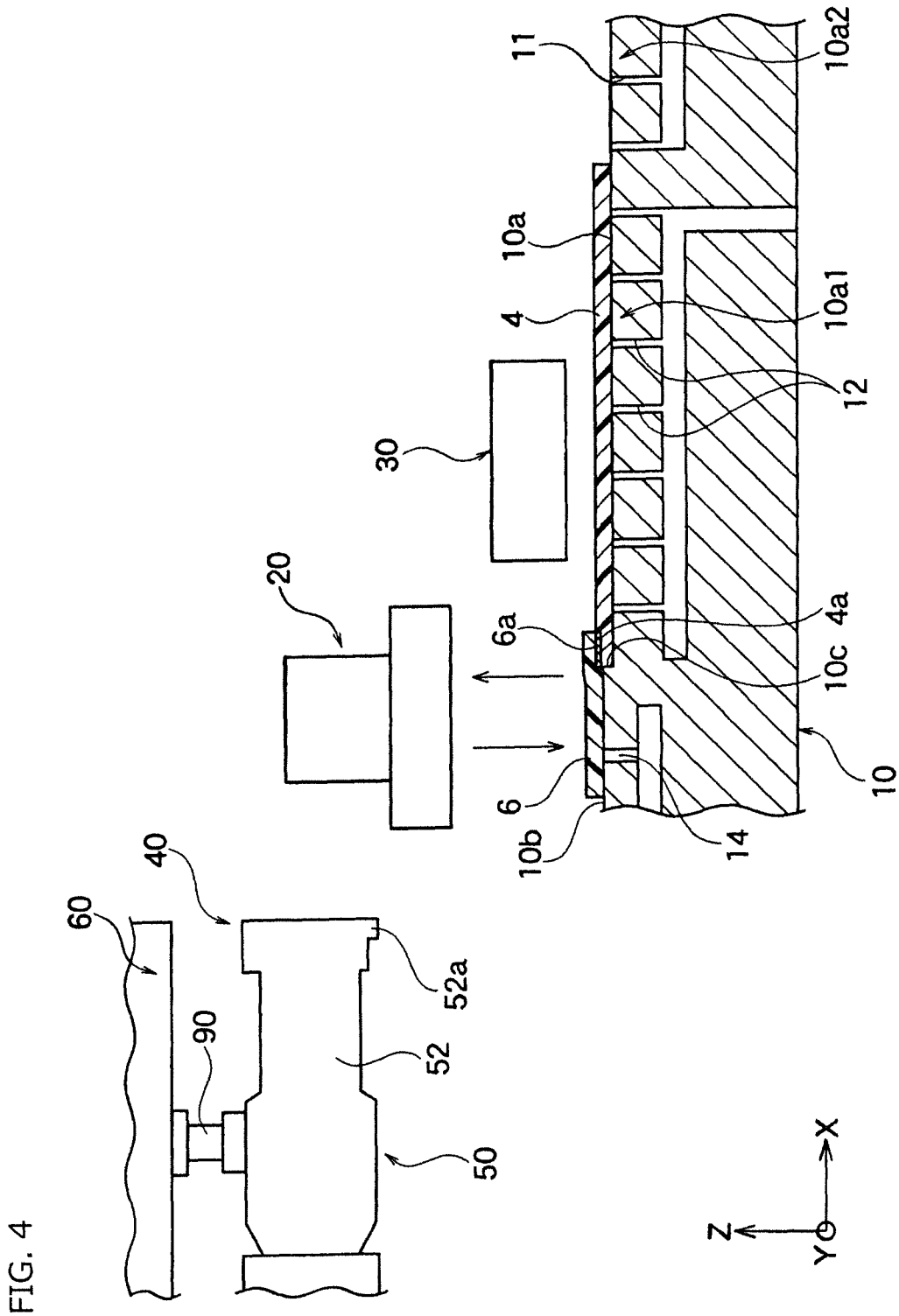
FIG. 4 is a schematic view illustrating the next step of FIG. 3.
Figure 5B:
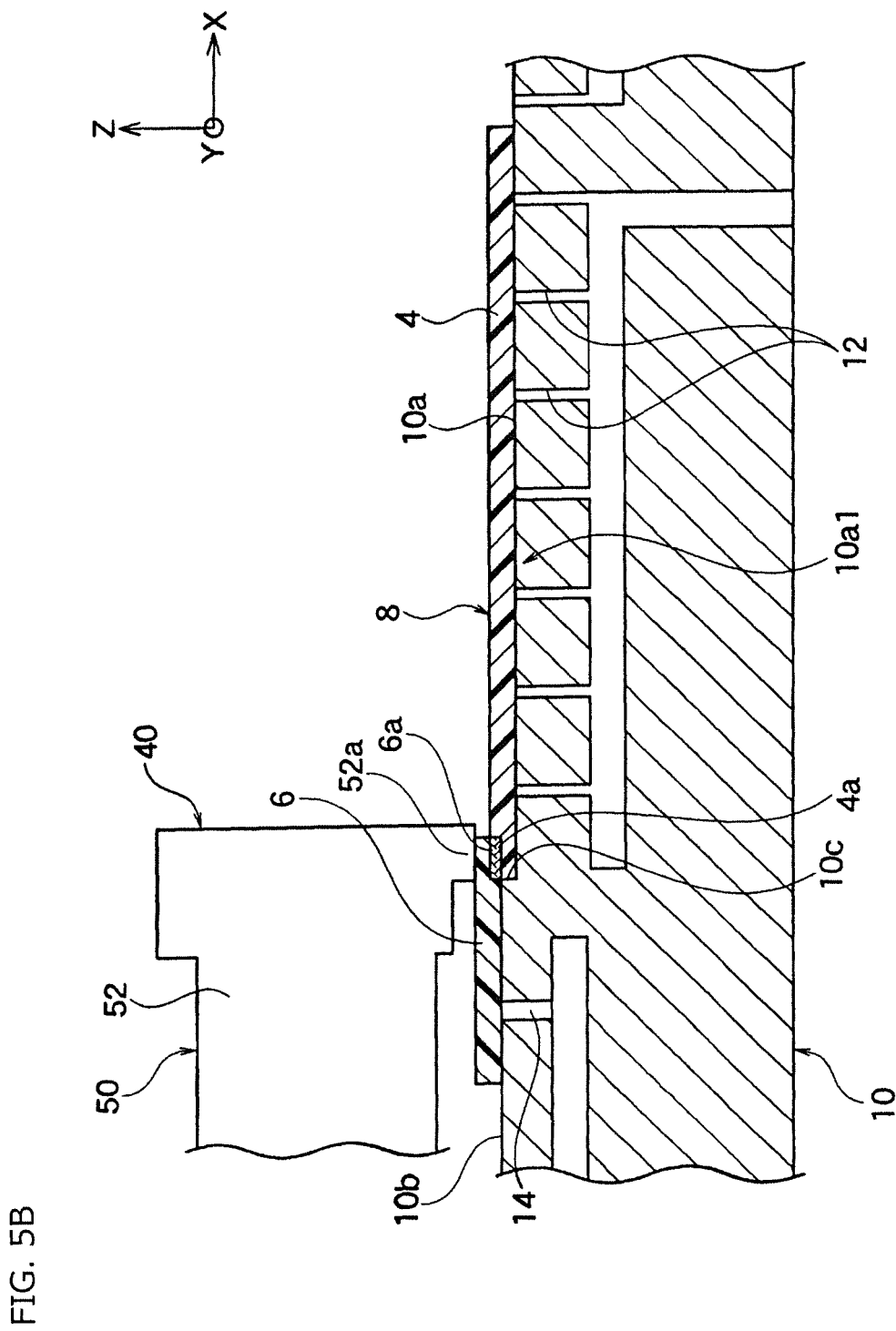
FIG. 5B is a schematic view illustrating the next step of FIG. 5A.

In Third Embodiment, described is a method of manufacturing a board bonded body 8 shown in FIG. 5B by the ultrasonic bonding method shown in FIG. 2B to FIG. 5B using the ultrasonic bonding device 2 shown in FIG. 2A including the ultrasonic bonding head 40 according to an embodiment of the present invention shown in FIG. 1A to FIG. 1G combined with the ultrasonic vibrator unit 50 shown in FIG. 1H to FIG. 1M.

As shown in FIG. 5B, the board bonded body 8 includes an electronic control board 4 (first flat member) and a flexible board 6 (second flat member). The electronic control board 4 may be a liquid crystal display panel, an organic EL display panel, or another display panel and may include, for example, a glass board.

The flexible board 6 is a board for supplying any signal and electric power to the electronic control board 4. A wiring pattern 4a of the electronic control board 4 and a wiring pattern 6a of the flexible board 6 are electrically connected to each other per pattern.

In the board bonded body 8 shown in FIG. 5B, after the wiring pattern 4a and the wiring pattern 6a are ultrasonically bonded, the flexible board 6 is bent from the edge near the wiring pattern 4a of the electronic control board 4 to the backside and is, for example, contained in a casing of a smart phone. In this structure, the entire surface close to the outer shape size of the casing can be utilized as a display screen of the electronic control board 4.

In view of this, an overlapping width x1 of the wiring pattern 4a and the wiring pattern 6a in the X-axis direction (see FIG. 5A) is demanded to be smaller as much as possible, such as 0.5 mm or less (preferably, 0.2 mm or less). In accordance with high refinement of displays, a wiring pitch interval of the wiring pattern 4a and the wiring pattern 6a in the Y-axis direction becomes smaller, such as tens of microns or smaller (preferably, 20 μm or less). In the figures, the board 6 is illustrated to be as thick as the board 4, but the board 6 is actually thinner than the board 4. Instead, the board 6 may be as thick as the board 4 or may be thicker than the board 4.

In the present embodiment, the ultrasonic bonding device 2 shown in FIG. 2A is used for electrically connecting the wiring pattern 4a of the electronic control board 4 with the wiring pattern 6a of the flexible board 6 per pattern.

As shown in FIG. 2A, the ultrasonic bonding device 2 of the present embodiment includes a stage 10 and an ultrasonic bonding head 40. The electronic control board 4 and the flexible board 6 to be bonded are placed on the stage 10. The ultrasonic bonding head 40 includes the ultrasonic vibrator unit 50 having a press part 50a for pressing a lamination portion of the electronic control board 4 and the flexible board 6. The ultrasonic bonding head 40 is similar to the head 40 according to First Embodiment, but may be another ultrasonic bonding head.

A transportation head 20 is disposed above the stage 10 in the Z-axis direction so as to be relatively movable to the stage 10 in the X-axis direction, the Y-axis direction, and the Z-axis direction. While shifting from the transportation head 20 in the Z-axis direction, a camera 30 is disposed above the stage 10 in the Z-axis direction so as to be relatively movable to the stage 10 at least in the X-axis direction and the Y-axis direction. As with the transportation head 20, the camera 30 may also be disposed so as to be relatively movable to the stage 10 in the Z-axis direction.

The ultrasonic bonding head 40 is disposed so as not to collide with the transportation head 20 and the camera 30 and so as to be relatively movable to the stage 10 in the X-axis direction, the Y-axis direction, and the Z-axis direction. The term "relatively movable" means that one may be movable to the other, the other may be movable to one, or one and the other may mutually be movable, and a relative position between one and the other changes.

A relative movement of the stage 10, the ultrasonic bonding head 40, a suction head 20, and the camera 30 is controlled by a control means (not illustrated). The control means may also control the device 2. The control means may also process an image obtained by the camera 30 and control a negative pressure of suction holes 11, 12, and 14 mentioned below. The control means may be a special circuit or may be constituted by a general-purpose computer with control program.

In the figures, the X-axis, the Y-axis, and the Z-axis are substantially perpendicular to each other. The Z-axis corresponds to a height direction of the device 2, the X-axis corresponds to a longitudinal direction of the electronic control board 4 or the flexible board 6, and the Y-axis corresponds to a width direction of the electronic control board 4 or the flexible board 6. The X-axis and the Y-axis are substantially parallel to the display of the electronic control board 4.

The upper surface of the stage 10 in the Z-axis direction includes at least a lower-side surface 10a, a higher-side surface 10b, and a step wall surface 10c. The electronic control board 4 is placed on the lower-side surface 10a. The higher-side surface 10b is positioned higher than the lower-side surface 10a by a step height z1. The step wall surface 10c is positioned in a boundary between the lower-side surface 10a and the higher-side surface 10b. The lower-side surface 10a and the higher-side surface 10b are substantially parallel to the X-Y axis plane. The step wall surface 10c is substantially parallel to the Z-Y axis plane.

The lower-side surface 10a includes a bonding position 10a1 and a standby position 10a2. The electronic control board 4 is placed at the bonding position 10a1 The flexible board 6 is temporarily placed at the standby position 10a2 away from the bonding position 10a1 in the X-axis direction (or the Y-axis direction). A plurality of first suction holes 12 formed inside the stage 10 is open at the bonding position 10a1 on the lower-side surface 10a. A plurality of standby suction holes 11 formed inside the stage 10 is open at the standby position 10a2 on the lower-side surface 10a.

When a negative pressure applies to the first suction holes 12, the electronic control board 4 placed at the bonding position 10a1 can detachably temporarily be suctioned and fixed at the bonding position 10a1 on the lower-side surface 10a. At the bonding position 10a1, the electronic control board 4 is disposed so that a connection scheduled part of the wiring pattern 4a formed on the board 4 faces upward in the Z-axis direction and so that the edge of the board 4 near the connection scheduled part of the wiring pattern 4a bumps into (contacts with) the step wall surface 10c. For example, the suction head 20 shown in FIG. 2A or another suction head can be used as a means for disposing the electronic control board 4 at the bonding position 10a1 on the lower-side surface 10a in the above-mentioned manner.

When a negative pressure applies to the standby suction holes 11, the flexible board 6 placed at the standby position 10a2 can detachably temporarily be suctioned and fixed at the standby position 10a2 on the lower-side surface 10a. At the standby position 10a2, the flexible board 6 is disposed so that a connection scheduled part of the wiring pattern 6a formed on the board 6 faces downward in the Z-axis direction and so that the edge of the board 6 near the connection scheduled part of the wiring pattern 6a faces the opposite side of the electronic control board 4 in the X-axis direction. For example, the suction head 20 shown in FIG. 2A can be used as a means for disposing the flexible board 6 at the standby position 10a2 on the lower-side surface 10a in the above-mentioned manner.

In the present embodiment, the step height z1 of the step wall surface 10c is equal to or less than the thickness t0 of the electronic control board 4, and the difference (t0−z1) is preferably 0 to 20 μm, more preferably 10 to 20 μm.

In the vicinity of the step wall surface 10c, a plurality of second suction holes 14 formed inside the stage 10 is open to the higher-side surface 10b of the stage 10. When a negative pressure applies to the second suction holes 14, as shown in FIG. 4, the flexible board 6 placed on the higher-side surface 10b can detachably temporarily be suctioned and fixed to the higher-side surface 10b in the vicinity of the step wall surface 10c. For example, the suction head 20 is used as a means for disposing the flexible board 6 on the higher-side surface 10b in the vicinity of the step wall surface 10c.

Next, explained is an ultrasonic bonding method using the ultrasonic bonding device 2 shown in FIG. 2A. As shown in FIG. 2B, the negative pressure of the standby suction hole 11 being open at the standby position 10a2 on the lower-side surface 10a is initially released, and the flexible board 6 positioned at the standby position 10a2 is lifted upward in the Z-axis direction by the suction head 20. The suction head 20 has a mechanism that suctions and holds the board 6 on the lower surface of the suction head 20 by suction force, for example.

After that, as shown in FIG. 3, the suction head 20 moves with the board 6 to the stage 10 in the X-axis direction. Incidentally, the stage 10 may move in the X-axis direction. The suction head 20 relatively moves to the stage 10 in the X-axis direction so that the board 6 held by the suction head 20 is positioned above the higher-side surface 10b in the vicinity of the step wall surface 10c. This movement is controlled by the control means.

The camera 30 enters between the wiring pattern 4a and the wiring pattern 6a and films their positional relation so that the connection scheduled portion of the wiring pattern 6a of the board 6 is accurately positioned with the connection scheduled portion of the wiring pattern 4a of the board 4, and the control means processes the image. Based on the result of the image processing, the control means relatively moves the suction head 20 to the stage 10 in the X-axis direction and the Y-axis direction so that the connection scheduled portion of the wiring pattern 6a of the board 6 is accurately positioned with the connection scheduled portion of the wiring pattern 4a of the board 4. If necessary, the control means may rotate the suction head 20 around the axis of the suction head 20 and move it to the stage 10 by controlling the movement mechanism.

Next the camera 30 moves from between the board 6 and the stage 10 in the X-axis direction and escapes to a position where the movement of the suction head 20 in the Z-axis direction is not disturbed. As shown in FIG. 4, the suction head 20 thereafter moves to the higher-side surface 10b of the stage 10, releases the suction holding of the board 6, and places the board 6 on the higher-side surface 10b. At the same time, a negative pressure applies to the second suction holes 14, and the board 6 is suctioned and held on the higher-side surface 10b. During this state, the lower surface of the edge of the board 6 in the X-axis direction and the upper surface of the edge of the board 4 in the X-axis direction overlap with each other, and a laminated portion is formed at a corresponding position to the step wall surface 10c. In the laminated portion, the connection scheduled portion of the wiring pattern 4a and the connection scheduled portion of the wiring pattern 6a face each other.

Next, as shown in FIG. 5A, the stage 10 relatively moves to the suction head 20 and the camera 30 in the X-axis direction, and the press part 52a of the ultrasonic vibrator unit 50 is positioned right above the laminated portion of the wiring patterns 6a and 4a in the Z-axis direction. Incidentally, a relative movement of the stage 10 and the ultrasonic vibrator unit 50 in the X-axis direction is controlled in advance so that the press part 52a of the ultrasonic vibrator unit 50 is positioned over the lower-side surface 10a within a predetermined range x3 in the X-axis direction.

That is, the movement mechanism is controlled by the control means so that the press part 52a of the ultrasonic vibrator unit 50 presses the laminated portion positioned on the lower-side surface 10a within a predetermined range x3 from the step wall surface 10c. Incidentally, the predetermined range x3 is preferably larger than zero and smaller than the length x1 of the laminated portion in the X-axis direction. That is, the press part 52a is controlled so as not to press the surface of the board 6 positioned on the higher-side surface 10b.

The length x1 of the laminated portion in the X-axis direction also corresponds to an overlapping length of the connection scheduled portions of the wiring patterns 4a and 6a and is demanded to be small as much as possible, such as 0.5 mm or less (preferably, 0.2 mm or less). A length x2 of the press part 52a, which presses the overlapping portion of the boards 4 and 6 (laminated portion), in the X-axis direction is preferably equal to or larger than the length x1 of the laminated portion in the X-axis direction. The difference (x2−x1) in length is preferably zero or more and 0.5 mm or less, more preferably 0.01 to 0.08 mm.

Next, as shown in FIG. 5A and FIG. 5B, the ultrasonic vibrator unit 50 relatively moves downward to the stage 10 in the Z-axis direction, the press part 52a of the ultrasonic vibrator unit 50 presses the laminated portion of the boards 4 and 6, and a press force in the Z-axis direction and an ultrasonic vibration in the X-axis direction are added to the laminated portion. As a result, metals of the wiring patterns 4a and 6a of the laminated portion being long in the X-axis direction and arranged at a predetermined pitch interval in the Y-axis direction are ultrasonically solid-phase bonded.

The metals forming the wiring patterns 4a and 6a may be any metal capable of ultrasonic bonding (including alloy), such as silver, gold, aluminum, and alloys containing these as main components. Incidentally, an antioxidant film whose main component is titanium or so may be formed on the surface of these metals (particularly, the surface of aluminum).

In a method of manufacturing the board bonded body 8 of the present embodiment (including the ultrasonic bonding method), since the step wall surface 10c is formed on the stage 10, the electronic control board 4 and the flexible board 6 are easily positioned using the step wall surface 10c, and the wiring patterns 4a and 6a can ultrasonically be bonded. Thus, even if the wiring pitch interval in the Y-axis direction is small (e.g., tens of microns or less), the electronic control board 4 and the flexible board 6 are easily electrically connected without generation of short-circuit failure or so. Incidentally, it is preferred that the ultrasound does not vibrate in the lamination direction of the laminated portion (Z-axis direction), but vibrates in a direction along the longitudinal direction of the wiring patterns 4a and 6a to be bonded.

In recent years, a large display close to an outer casing size of a device (e.g., a display of smart phones) has been demanded. Thus, the bonding length x1 of the wiring patterns 4a and 6a must be short, and the connection reliability is becoming a problem. In the method of the present embodiment, however, the metals can ultrasonically be solid-phase bonded, and the connection becomes reliable.

In the method of manufacturing the board bonded body of the present embodiment, since the step wall surface 10c is formed on the stage 10, the wiring patterns can securely ultrasonically be bonded even if the laminated portion of the electronic control board 4 and the flexible board 6 has a large width in the Y-axis direction (e.g., 60 mm or more).

In the present embodiment, the movement mechanism is controlled by the control means so that the press part 52a of the ultrasonic vibrator unit 50 presses the laminated portion positioned on the lower-side surface 10a within a predetermined range from the step wall surface 10c. For the ultrasonic bonding, the press part 52a of the ultrasonic vibrator unit 50 does not preferably press the flexible board 6 positioned on the higher-side surface 10b, but preferably presses only the laminated portion. In this structure, the ultrasonic bonding of the wiring patterns 4a and 6a becomes more reliable without generation of disconnection of the wiring patterns or so.

Other Variations

Incidentally, the present invention is not limited to the above-mentioned embodiments, but may variously be changed within the scope of the present invention.

For example, the electronic control board 4 is not only a stiff board including a glass board, but may be a flexible board with softness.

The second flat member is the flexible board 6 in the above-mentioned embodiments, but is not limited.

Moreover, the bonding scheduled part of the present embodiment applies to not only a bonding scheduled part of boards, but to an ultrasonic bonding of a bonding scheduled part of any other material. The bonding of any other material can apply to a bonding of semiconductor elements, such as CMOS sensor, CCD sensor, and LED. Incidentally, the ultrasonic bonding head and the ultrasonic bonding device of the present invention are particularly effective when used for bonding of boards. This is because the present invention can achieve a favorable ultrasonic bonding with a downsized device, while conventional devices tend to be large as a region to be bonded is demanded to be wide in bonding of boards.

Moreover, the stage of the present invention is the stage 10 having the step wall surface 10c in the above-mentioned embodiments, but may be a normal stage having no step wall surface. The ultrasonic bonding head of the present invention does not necessarily have a stage.

In the above-mentioned embodiments, the holder 60 holds the booster 54, but may hold the ultrasonic horn 52 at the vibration nodes. The holder 60 may be in contact with the booster 54, not with the ultrasonic horn 52. The vibrator unit of the present invention may not be a combination of the ultrasonic horn 52, the booster 54, and the vibration source and, for example, may be a vibrator unit failing to include the booster 54.

DESCRIPTION OF THE REFERENCE NUMERICAL

2 . . . ultrasonic bonding device
4 . . . electronic control board (first flat member)
4a . . . wiring pattern
6 . . . flexible board (second flat member)
6a . . . wiring pattern
8 . . . board bonded body
10 . . . stage
10a . . . lower-side surface
10a1 . . . bonding position
10a2 . . . standby position
10b . . . higher-side surface
10c . . . step wall surface
11 . . . standby suction hole
12 . . . first suction hole
14 . . . second suction hole
20 . . . transportation head
30 . . . camera
40 . . . ultrasonic bonding head
50 . . . ultrasonic vibrator unit
52 . . . ultrasonic horn
52a . . . press part
54 . . . booster
56 . . . vibration source cover
58 . . . cable
60 . . . holder
62 . . . upper holder
63 . . . pressure transmission block
64 . . . lower holder
70 . . . auxiliary holder
72 . . . upper holder
73 . . . attachment flange
74 . . . lower holder
80 . . . pressurizing shaft
82 . . . fixed board
90 . . . restraint pin (restraint portion)
92 . . . contact part

What is claimed is:

1. An ultrasonic bonding head comprising:
a vibrator unit (1) having a longitudinal axis, (2) having a press part at a tip of the vibrator unit along the longitudinal axis, (3) configured to press a bonding scheduled part to be bonded, and (4) having a plurality of vibration nodes along the longitudinal axis during operation;
a holder that holds a base of the vibrator unit in a cantilever manner at a main hold position such that the tip is a free end; and
a pressurizing shaft connected with the holder and configured to transmit a force of pressing the press part against the bonding scheduled part so that the vibrator unit moves along a perpendicular axis substantially perpendicular to the longitudinal axis,
wherein
the holder includes (1) a restraint portion configured to contact the vibrator unit at a counterforce dispersion position between the main hold position and the tip of the vibrator unit along the longitudinal axis and (2) an auxiliary holder that holds a cover covering a vibration source of the vibrator unit at a sub hold position differing from the main hold position along the longitudinal axis,
the counterforce dispersion position is at a first of the plurality of vibration nodes closest to the tip of the vibrator unit,
the sub hold position is at a second of the plurality of the vibration nodes closest to the vibration source, and
the main hold position is at a third of the plurality of vibration nodes between the counterforce dispersion position and the sub hold position.

2. The ultrasonic bonding head according to claim 1, wherein the restraint portion and the press part are configured such that a first position where the restraint portion contacts the vibrator unit and a second position where the press part is intended to contact the bonding scheduled part are different along the longitudinal axis and are on opposite sides of the longitudinal axis.

3. The ultrasonic bonding head according to claim 1, wherein
a core axis of the pressurizing shaft is substantially parallel to the perpendicular axis, and the pressurizing shaft is connected with the holder so that the core axis is located between the main hold position and the counterforce dispersion position.

4. The ultrasonic bonding head according to claim 1, wherein the vibrator unit includes a vibration source for ultrasonically vibrating the press part in a parallel direction to the longitudinal axis.

5. The ultrasonic bonding head according to claim 1, wherein the restraint portion has a low friction processed part that contacts the vibrator unit for improving a relative movement between the restraint portion and the vibrator unit along the longitudinal axis.

6. An ultrasonic bonding head comprising:
　a vibrator unit (1) having a longitudinal axis, (2) having a press part at a tip of the vibrator unit along the longitudinal axis and (3) configured to press a bonding scheduled part to be bonded;
　a holder that holds a base of the vibrator unit along the longitudinal axis in a cantilever manner at a main hold position such that the tip is a free end; and
　a pressurizing shaft connected with the holder and configured to transmit a force of pressing the press part against the bonding scheduled part so that the vibrator unit moves along a perpendicular axis substantially perpendicular to the longitudinal axis, wherein
　the holder includes (1) a restraint portion configured to contact the vibrator unit at a counter force dispersion position and (2) an auxiliary holder that holds a cover covering a vibration source of the vibrator unit at a sub hold position,
　the counterforce dispersion position is between the tip and the main hold position along the longitudinal axis,
　the vibrator unit has at least three vibration nodes along the longitudinal axis during operation, and
　the main hold position, the sub hold position and the counterforce dispersion position are at different of the at least three vibration nodes.

7. An ultrasonic bonding device comprising the ultrasonic bonding head according to claim 1.

8. An ultrasonic bonding device comprising the ultrasonic bonding head according to claim 6.

9. An ultrasonic bonding method for ultrasonically bonding a bonding scheduled part using the ultrasonic bonding head according to claim 1.

10. An ultrasonic bonding method for ultrasonically bonding a bonding scheduled part using the ultrasonic bonding head according to claim 6.

* * * * *